United States Patent
Tilke et al.

(10) Patent No.: US 10,573,730 B2
(45) Date of Patent: *Feb. 25, 2020

(54) BIPOLAR TRANSISTOR

(71) Applicant: Infineon Technologies AG, Neubiberg (DE)

(72) Inventors: Armin Tilke, Dresden (DE); Claus Dahl, Dresden (DE); Dmitri Alex Tschumakow, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,495

(22) Filed: Jun. 25, 2018

(65) Prior Publication Data

US 2018/0308961 A1 Oct. 25, 2018

Related U.S. Application Data

(63) Continuation of application No. 14/860,431, filed on Sep. 21, 2015, now Pat. No. 10,032,893.

(30) Foreign Application Priority Data

Sep. 26, 2014 (DE) .......... 10 2014 113 989

(51) Int. Cl.
*H01L 29/732* (2006.01)
*H01L 29/08* (2006.01)
(Continued)

(52) U.S. Cl.
CPC ...... *H01L 29/732* (2013.01); *H01L 21/76224* (2013.01); *H01L 29/04* (2013.01);
(Continued)

(58) Field of Classification Search
CPC .............. H01L 29/1004; H01L 29/73; H01L 29/42304; H01L 29/7322–7327; H01L 29/66287
See application file for complete search history.

(56) References Cited

U.S. PATENT DOCUMENTS 5,402,002 A 3/1995 Meister et al.
7,323,390 B2 1/2008 Heinemann et al.
(Continued)

FOREIGN PATENT DOCUMENTS

EP 0418421 A1 3/1991
WO 03046948 A2 6/2003

OTHER PUBLICATIONS

Prosecution History from U.S. Appl. No. 14/860,431, dated Apr. 29, 2016 through Mar. 26, 2018, 116 pp.
(Continued)

*Primary Examiner* — Stephen M Bradley
(74) *Attorney, Agent, or Firm* — Shumaker & Sieffert, P.A.

(57) ABSTRACT

A bipolar transistor is described. In accordance with one aspect of the present invention the bipolar transistor comprises a semiconductor body including a collector region and a base region arranged on top of the collector region. The base region has a first crystalline structure and is at least partly doped with dopants of a first doping type. The collector region is laterally enclosed by a trench isolation and is doped with dopants of a second doping type. The transistor further comprises a conductive base contact layer laterally enclosing the base region which is doped with dopants of the first doping type. The base contact layer comprises a part with the first crystalline structure and a part with a second crystalline structure, wherein the part with the second crystalline structure laterally encloses the part with the first crystalline structure. The transistor further com-
(Continued)

prises an emitter region arranged on the base region, wherein the emitter region is doped with dopants of the second doping type and forming a pn-junction with the base region.

11 Claims, 6 Drawing Sheets

(51) Int. Cl.
    *H01L 29/10*     (2006.01)
    *H01L 29/04*     (2006.01)
    *H01L 29/06*     (2006.01)
    *H01L 29/66*     (2006.01)
    *H01L 21/762*     (2006.01)
    *H01L 29/423*     (2006.01)
    *H01L 29/45*     (2006.01)
    *H01L 29/737*     (2006.01)

(52) U.S. Cl.
    CPC ...... *H01L 29/0649* (2013.01); *H01L 29/0804* (2013.01); *H01L 29/0821* (2013.01); *H01L 29/1004* (2013.01); *H01L 29/42304* (2013.01); *H01L 29/66272* (2013.01); *H01L 29/66287* (2013.01)

(56) References Cited

U.S. PATENT DOCUMENTS

| | | | |
|---|---|---|---|
| 8,810,005 | B1 | 8/2014 | Camillo-Castillo et al. |
| 10,032,893 | B2* | 7/2018 | Tilke .................... H01L 29/732 |
| 2004/0014271 | A1 | 1/2004 | Cantell et al. |
| 2005/0151225 | A1 | 7/2005 | Adam et al. |
| 2007/0224747 | A1 | 9/2007 | Rochel et al. |
| 2008/0227262 | A1 | 9/2008 | Ei-Kareh et al. |
| 2008/0296623 | A1 | 12/2008 | Wilhelm |
| 2012/0001192 | A1 | 1/2012 | Fox et al. |
| 2013/0313614 | A1* | 11/2013 | Fu .................... H01L 29/66318 257/197 |
| 2014/0361300 | A1 | 12/2014 | Camillo-Castillo et al. |
| 2016/0093722 | A1 | 3/2016 | Tilke et al. |

OTHER PUBLICATIONS

Summons to Attend Oral Proceedings, in the German language, from German Patent Application No. 102014113989.5, dated Sep. 4, 2019, 2 pages.

Office Action, in the German language, from counterpart German Application No. 102014113989.5, dated Jul. 7, 2015, 6 pp.

\* cited by examiner

BIPOLAR TRANSISTOR

This application is a continuation of U.S. patent application Ser. No. 14/860,431, filed Sep. 21, 2015, which claims priority to DE Application 102014113989.5 filed Sep. 26, 2014. The entire content of U.S. patent application Ser. No. 14/860,431 is incorporated by reference herein.

TECHNICAL FIELD

The present disclosure relates to the field of bipolar transistors (BTs) such as, for example, heterojunction bipolar transistors (HBTs). Particularly, a bipolar transistor and a method for fabricating bipolar transistors are described.

BACKGROUND

Bipolar transistors are generally composed by two adjacent pn-junctions lying close together in a semiconductor crystal. In different configurations, either two n-doped regions are separated by a p-doped region (npn-type transistor) or, alternatively, two p-doped regions by an n-doped region (pnp-type transistor). The three doped regions are generally referred to as emitter, base, and collector. Therefore, a bipolar transistor is a three terminal device having three doped regions of alternating doping type.

Bipolar transistors may exhibit desirable properties such as high current gain and high cut-off frequency for switching applications or microwave (RF) amplifier applications. These properties make bipolar transistors important components in logic circuits, communications systems, and microwave devices. As with other types of semiconductor devices, there is an increasing demand for bipolar transistors having high operating frequencies and/or switching speeds. Since their invention in 1947, many attempts have been made to meet these demands and improve the performance of such transistors with respect to their speed, power, and frequency characteristics. These attempts have focused on making devices better suited for high frequency applications such as microwave and logic devices. One particular way to meet these demands for transistors with high cut-off frequencies and high current gain is to reduce external base resistance (also referred to as base link resistance) and a low leakage current. Leakage currents may occur, when dislocations diffuse from the interface between external base contact layer (e.g. polycrystalline silicon) and internal base region (monocrystalline silicon) into the active portion of the base region. In order to avoid these diffusion of dislocations into the active portion of the base regions, the distance between the active portion of the base region and the mentioned interface should not be too short. Although, a further reduction of this distance would reduce the base link resistance this would also entail an undesired increase of leakage current. Thus, there is a conflict of objectives when designing the geometry of a bipolar transistor.

SUMMARY

A bipolar transistor is described. In accordance with one aspect of the present invention the bipolar transistor comprises a semiconductor body including a collector region and a base region arranged on top of the collector region. The base region has a first crystalline structure and is at least partly doped with dopants of a first doping type. The collector region is laterally enclosed by a trench isolation and is doped with dopants of a second doping type. The transistor further comprises a conductive base contact layer laterally enclosing the base region which is doped with dopants of the first doping type. The base contact layer comprises a part with the first crystalline structure and a part with a second crystalline structure, wherein the part with the second crystalline structure laterally encloses the part with the first crystalline structure. The transistor further comprises an emitter region arranged on the base region, wherein the emitter region is doped with dopants of the second doping type and forming a pn-junction with the base region.

Furthermore, a method for fabricating a bipolar transistor is disclosed. The method comprises providing a semiconductor body including a buried contact layer, forming a base contact layer on top of the semiconductor body with the base contact layer being doped with dopants of the first doping type, forming an insulating layer on top of the base contact layer, forming an opening through the insulating layer and the base contact layer to expose a top surface of the semiconductor body, and forming a collector region through the opening in a first semiconductor layer doped with dopant atoms of the second doping type. The method further comprises forming a base region on top of the collector region with the base region being doped with dopants of the first doping type and the base region laterally adjoining the base contact layer. An emitter region is formed with dopants of the second doping type on top of the base region so that the spacers laterally enclose the emitter region.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. More-over, in the figures, like reference numerals designate corresponding parts. In the drawings.

DETAILED DESCRIPTION

Figure 1:
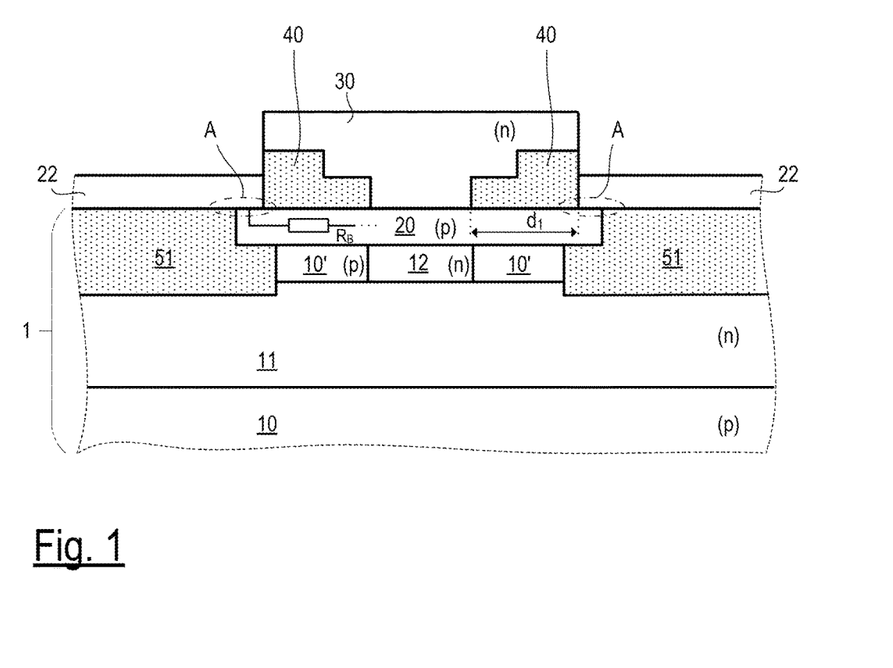
FIG. 1 illustrates one example of a bipolar transistor resulting from a conventional bipolar or BICMOS manufacturing process.

FIG. 1 illustrates a cross sectional view of an exemplary bipolar transistor (BT), which may be fabricated using known bipolar or BICMOS technologies. The transistor is integrated in a semiconductor body 1, which is also referred to as "substrate" and which is formed by a silicon wafer and an (optional) epitaxial layer disposed thereon. The semiconductor body 1 includes a first and a second semiconductor region 10 and 10', which are doped with dopants of a first doping type; in the present example, a p-doped silicon substrate is used and thus the semiconductor regions 10 and 10' are p-doped to form a npn-type bipolar transistor. A buried contact region 11 is formed within the semiconductor body 1 vertically between the semiconductor regions 10 and 10'. A collector terminal (not shown) is electrically connected to the buried contact region 11 to electrically connect a collector region 12, which is arranged in the second semiconductor region 10' of the semiconductor body 1. The collector region 12 is above (and adjoining) the buried contact region 11 and doped with dopants of a second doping type (n-type dopants in the present example). The collector region 12 may be referred to as the collector of the BT. The second semiconductor regions 10' as well as the buried contact region 11 may be formed by epitaxial deposition, ion implantation or diffusion of dopants.

The semiconductor body 1 may also include a deep trench isolation (DTI, not shown) for isolating the contact region 11 in a lateral direction against the surrounding semiconductor body 1. Trenches 51 are arranged in the semiconductor body 1 to form a shallow trench isolation (STI). In the cross section, the shallow trenches 51 are spaced apart such that the mentioned collector region 12 lies (in a horizontal direction) in between the trenches 51 and embedded in the semiconductor region 10'. The trenches 51 are at least partially filled with an insulating dielectric material, e.g. silicon oxide. In a top view (not shown) the trench 51 may define a quadratic a hexagonal or a circular structure. On top of the collector region 12, a base region 20 is arranged so that it adjoins the collector region 12. The base region 20 is (in a horizontal direction) broader than the collector region 12 and is laterally confined by the silicon oxide disposed in or on the (shallow) trenches 51. The base region 20 is also doped with dopants of a first doping type (in the present example p-doped to form a npn-type transistor). The base region 20 may be formed of silicon. However, other semiconductor materials may be applicable, e.g. SiGe, to form a heterojunction bipolar transistor (HBT). The concentration of dopants may not be homogenous within the base region 20. In a vertical direction, the dopant concentration may exhibit a maximum within the base region 20. The base region 20 is often simply referred to as "base" of the BT. In the present example, the top surface of the base region 20 and the top surface of the silicon oxide layer disposed in or on the (shallow) trenches 51 are in the same horizontal plane.

A base contact layer 22 is deposited on top of the (filled) trenches 51 and the base region 20. For example, polycrystalline silicon may be used for forming the base contact layer 22. The base contact layer 22 is deposited such that it covers only a portion of the top surface of the base region 20 to electrically contact the base region 20 at its margin (interface A, see below). The base contact layer 22 of FIG. 1 has the function of electrically connecting an external base terminal (not shown) with the base region 20 of the BT.

On the portion of the top surface of the base region 20, which is not covered by the base contact layer 22, insulating spacers 40 are formed. The spacers 40 may be composed of at least one insulating dielectric material, e.g. silicon oxide or nitride. An emitter region 30 is laterally confined by these spacers 40. The emitter region 30 is often simply referred to as the "emitter" of the BT. The emitter region 30 is doped with dopants of the second doping type (n-doped in the present example of a non-type transistor).

At the interface A between the base contact layer 22 (low-resistance, polycrystalline silicon) and the base region 20 (monocrystalline silicon or SiGe) dislocations may occur in the silicon crystal, which may diffuse into the active portion of the base region 20. In order to reduce or avoid the mentioned diffusion, the distance $d_1$ between the interface A and the active portion of the base region is comparably high, which entails a correspondingly high base link resistance $R_B$.

Figure 2:
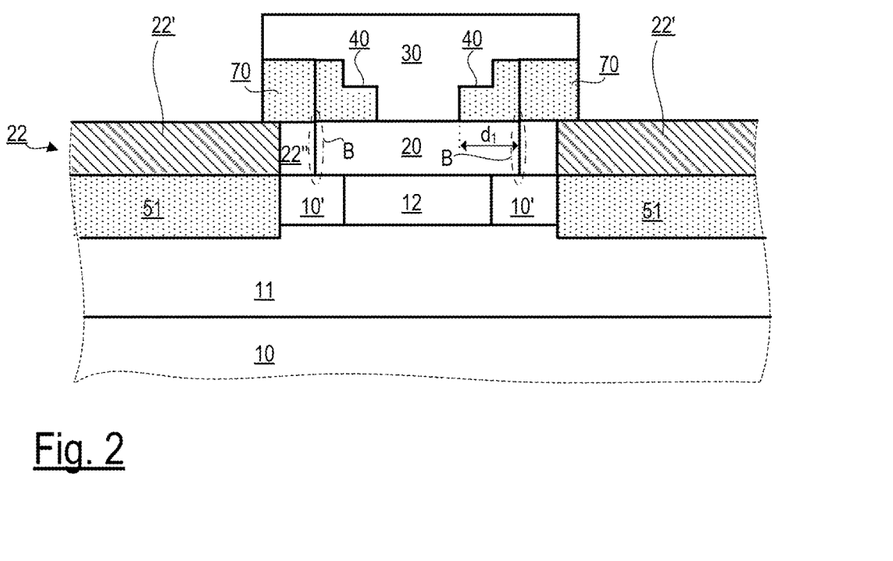
FIG. 2 illustrates one example of an improved bipolar transistor resulting from a bipolar or BICMOS manufacturing process described herein.

The exemplary embodiment illustrated in FIG. 2 is similar to the previous example of FIG. 1. However, the interface between the base region 20 and the base contact layer 22 is implemented in a different way to improve the base link resistance $R_B$ without increasing the diffusion of dislocations into the active portion of the base region 20. Accordingly, the base contact layer 22 and the base region 20 both lie in the same plane and adjoin (i.e. electrically connect) each other via their respective vertical side-walls. More precisely, the base contact layer includes two portions 22' and 22", which differ in their crystalline structure. The outer portion 22' of the base contact layer 22 has a polycrystalline structure, whereas the inner portion 22" is monocrystalline. This structure of the base contact layer 22 provides an interface B between the base contact layer 22 and the monocrystalline base region 20 without dislocations (or only a negligible amount of dislocations), which could diffuse into the base region 20. Thus, the interface B can be closer to the active portion of the base region 20 than in the previous example (i.e. distance $d_1$ is smaller), and the base link resistance $R_B$ of the device is reduced. The remaining components of the transistor of FIG. 2 are the same as in the previous example and thus not repeated here. In one example, the distance $d_1$ may even be set to zero, which means that spacer 40 is omitted. In this case the width (in a horizontal direction) of the base may be reduced to be the same as the width of collector region 12.

Below, one exemplary production process for fabricating the BT of FIG. 2 is described referring to the FIGS. 3A through 3K. It is understood that, in an actual implementation of the process, the order of the steps may be different from the order described herein. Furthermore, some steps may be substituted with one or more other steps yielding essentially the same result.

Figure 3A:
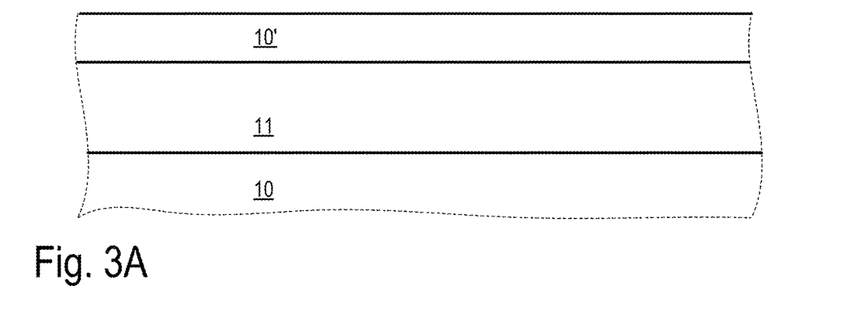
FIGS. 3A-3K describe one example of a process for manufacturing a bipolar transistor as shown in FIG. 2.

The further description starts with a semiconductor body 1 including a buried contact region 11 as shown in FIG. 3A. The buried contact region 11 is doped with dopants of the second doping type (e.g. n-type). The surrounding semiconductor body 1, that is the first semiconductor layer 10 and the second semiconductor layer 10' are be doped with dopants of the first doping type (e.g. p-type). Methods for providing such semiconductor bodies with buried contact regions and optional deep trench isolations (DTI) are as such known and thus not further described here in more detail.

Figure 3B:
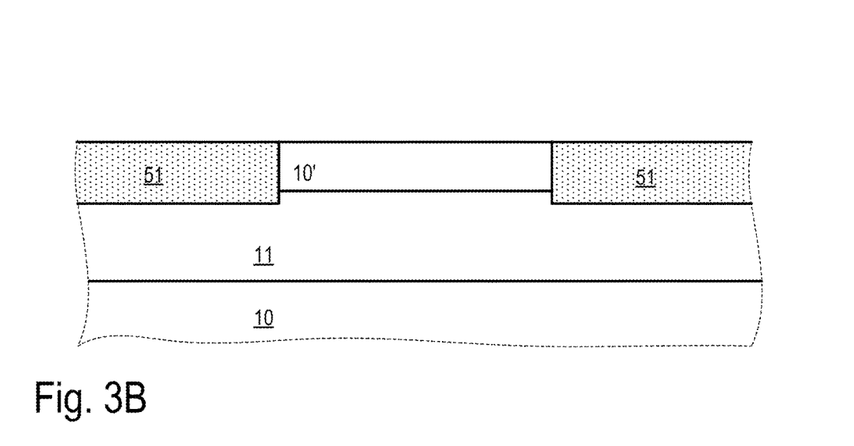

FIG. 3B illustrates the semiconductor body 1 of FIG. 3A with an additional shallow trenches 51 formed in the semiconductor body 1, in particular in the first semiconductor layer 10'. The trenches 51 are at least partially filled with insulating material (e.g. silicon oxide) to form a so-called shallow trench isolation (STI). In the present example of FIG. 3B, the shallow trenches 51 have a specific spacing. At least a part of the portion of the first semiconductor layer 10', which is between the shallow trenches 51, will later serve as the collector region 12 of the BT (see FIG. 3G).

Figure 3C:
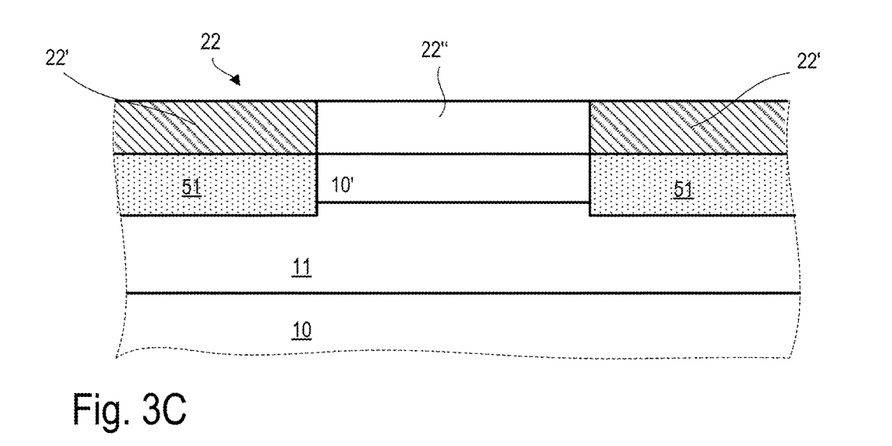

As can be seen in FIG. 3C a base contact layer 22 is deposited on the surface of the semiconductor body (i.e. on the semiconductor layer 10' and on the STI) after forming the shallow trenches 51. The base contact layer 22 may be formed, for example, by non-selective epitactic deposition of silicon. Using epitaxy, the crystalline structure of the deposited silicon is different on the STI (polycrystalline 22') than on the first semiconductor layer 10' (monocrystalline 22"). Another way may be depositing amorphous silicon, which gives monocrystalline structure on the first (monocrystalline) semiconductor layer 10' and amorphous silicon the STI, which can later (in a subsequent process step) be recrystallized into large polycrystalline grains by a proper furnace annealing process (to reduce the base link resistance). The polycrystalline structure 22' (and the amorphous structure respectively) of the base contact layer 22 are indicated by the hatched pattern.

Figure 3D:
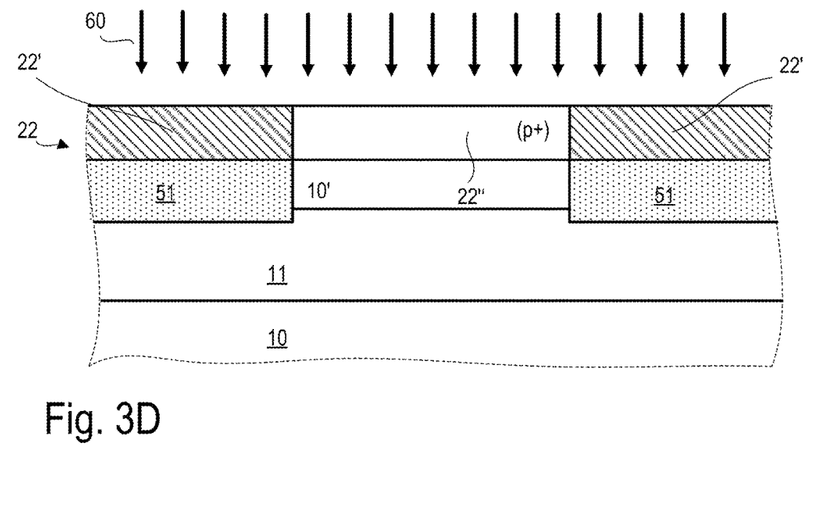

Subsequently, as shown in FIG. 3D, the base contact layer 22 may be doped using, for example, ion implantation. As a result, the base contact layer is highly doped with dopants of the first doping type (with a dopant concentration of up to $10^{21}$ cm$^{-3}$) and thus has a low electrical resistivity. The implantation of the dopants is a so-called shallow high dose implantation. The shallow implantation is required to make sure that no dopant atoms are implanted in the underlying first and second semiconductor layers 10', 10 as well as the buried contact layer 11. It should be noted, however, that the high concentration of dopants can also be achieved by other techniques such as diffusion of dopants (diffusion doping), plasma doping (PLAD) or similar techniques.

Figure 3E:
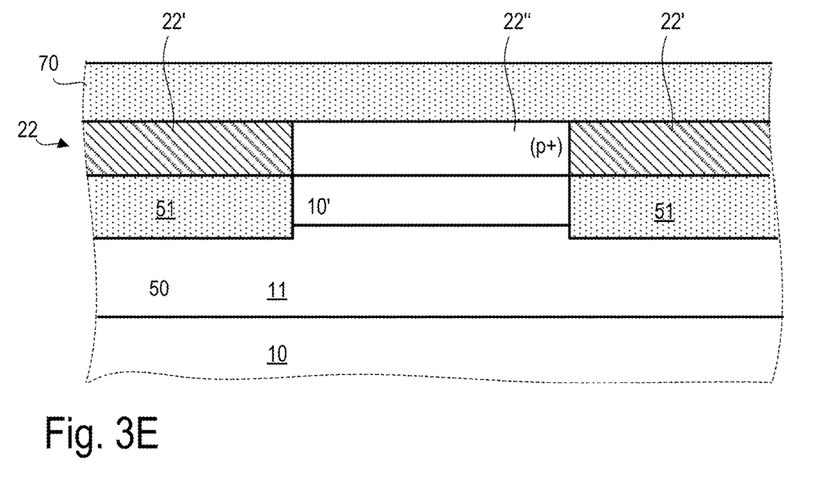

In the next process step, shown in FIG. 3E, an insulating layer 70 is deposited on top of the base contact layer 22. The insulating layer 70 may comprise a dielectrically insulating material like e.g. tetraethyl orthosilicate (TEOS) or nitride.

Figure 3F:
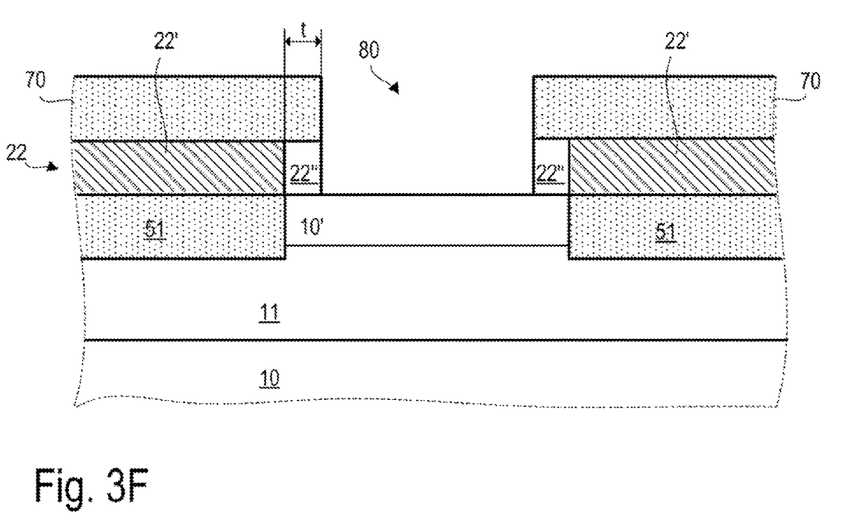

FIG. 3F illustrates the next process step. An opening 80 is formed, which vertically extends through the insulating layer 70 and the base contact layer 22 to expose surface of the subjacent semiconductor body 1, i.e. the first semiconductor layer 10'. In a horizontal direction, the width of the opening 80 is smaller than the distance between the shallow trenches 51. Thus, parts of the monocrystalline portion 22' of the base contact layer 22 remain under the insulating layer 70. The horizontal thickness t of the remaining monocrystalline portions 22" can be chosen such that the dislocations, which may occur at the polycrystalline/monocrystalline interface (between portions 22' and 22" of layer 22), do not diffuse through the entire thickness of the monocrystalline portions 22" of layer 22. Forming the opening 80 includes removing the (TEOS or nitride) insulation layer and part of the subjacent monocrystalline portion 22" of the base contact layer 22 using, e.g., dry etching. The exposed surface of the semiconductor body 1 is then subjected to a wet pretreatment to smoothen the surface. Thereby, the surface is subject to a chemical oxidation with subsequent oxide removal to remove all etch damages, which have been caused by the preceding dry etching process. The etching damages can also be removed (smoothened) by other techniques such as dry etching or thin thermal oxidation.

Figure 3G:
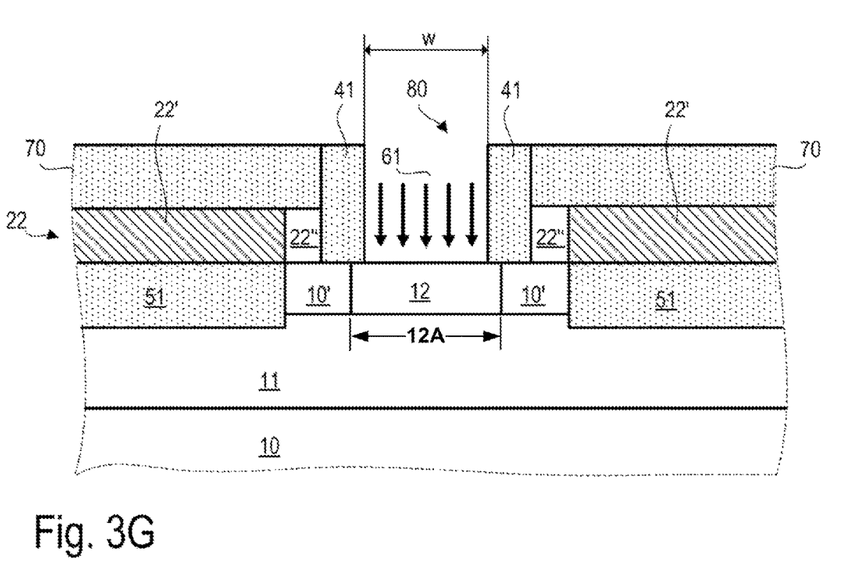

FIG. 3G illustrates the formation of the collection region 12. Accordingly, the collector region 12 is formed by ion implantation 61 of dopants into the first semiconductor layer 10' of semiconductor body 1 through the opening 80. The dopants used to form the collector region 12 are of the second doping type (concentration of dopants, e.g., between $10^{17}$ cm$^{-3}$ and $10^{19}$ cm$^{-3}$). Optionally, to confine the dopant implantation to the middle of the opening 80 (i.e. to the desired 'active region' of the BT) and to protect the monocrystalline base contact layer 22", two spacers 41 can be formed at the side walls of the opening 80. These spacers 41 adjoin the side-walls of the insulation layer 70 and the base contact layer 22" and form a mask for the implantation exposing only the portion of the semiconductor body, which later forms the collector region 12. This thickness of the individual spacers 41 defines the width w of the implanting window and thus the width of the active region of the BT. However, the actual width of the collector region, 12A, may be somewhat wider than the width w due to diffusion of the dopants during the subsequent process steps. As a result, the collector region 12 is laterally enclosed by the remaining portion of the first semiconductor layer 10'. After the ion implantation step 61 the spacers 41 may be removed.

Figure 3H:
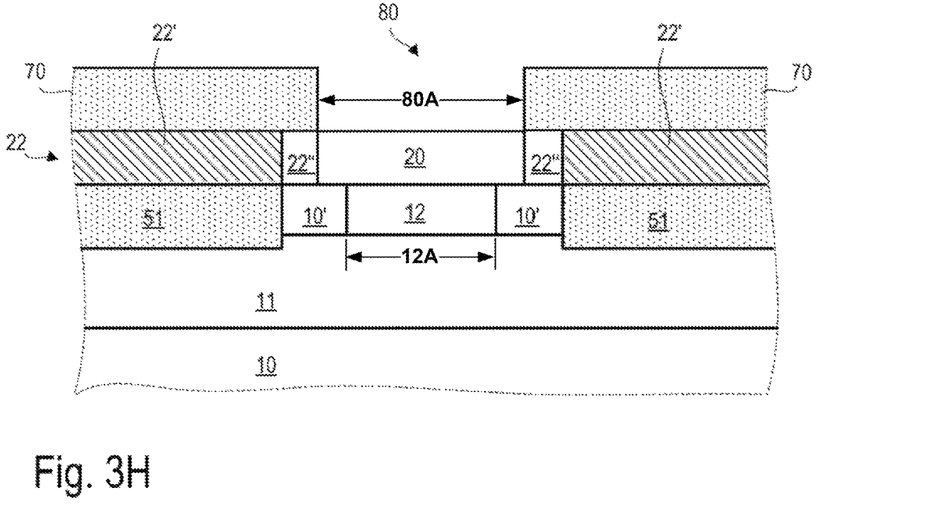

In a subsequent step, which is illustrated in FIG. 3H, the base layer 20 is formed on top of the collector region 12 and the first semiconductor layer 10' that laterally encloses the collector region 12. The base region 20 is formed, in opening 80 with width 80A, so that its side-walls adjoin the side-walls of the monocrystalline base contact layer 22" and form an electric contact. The base region 20 may be grown using selective epitactic growth. This results in a monocrystalline structure of the base region 20. This interface is self-aligned to the monocrystalline structure and thus has no dislocations that can diffuse into the base region and weaken the device performance. The base region 20 is formed with a vertical thickness that corresponds to the vertical thickness of the base contact layer 22. The base region 20 can be formed to be doped with dopants of the first doping type (concentration of dopants, e.g., between $10^{18}$ cm$^{-3}$ and $10^{20}$ cm$^{-3}$). However, the concentration of dopants is significantly lower than in the base contact layer 22. As mentioned above, a pretreatment of the surface of the semiconductor body 1 (the surface of the first semiconductor layer 10') introduced is useful to remove etch damages due to the preceding dry etching process. Such pretreatment may include, e.g., HCl-prebaking, chemical oxidation and oxide removal.

Figure 3I:
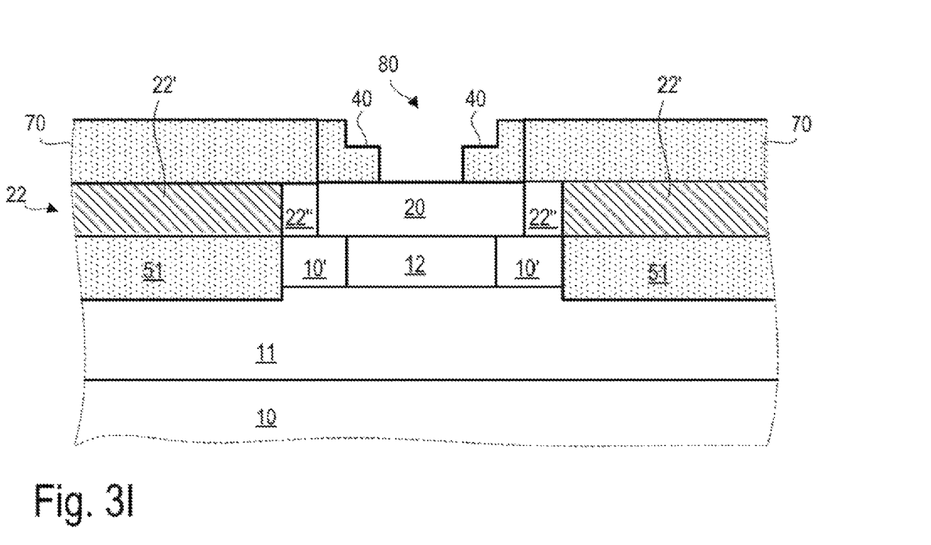

Subsequently, as shown in FIG. 3I, electrically insulating spacers 40 are formed within the opening 80 on the top surface of the base region 20 such that one side-wall of each spacer 40 adjoins a corresponding side-wall of the insulating layer 70. The spacers 40 are laterally (horizontally) spaced apart such that a portion of the top surface of the base region 20 remains exposed. The spacers 40 may have an L-shaped cross-section. The spacers may made of, e.g., TEOS like the insulating layer 70, silicon oxide or silicon nitride. In accordance with an alternative example, the spacers 40 may also be omitted to ensure a very short distance $d_1$ ($d_1$ of approximately zero) and thus a very low base resistance.

Figure 3J:
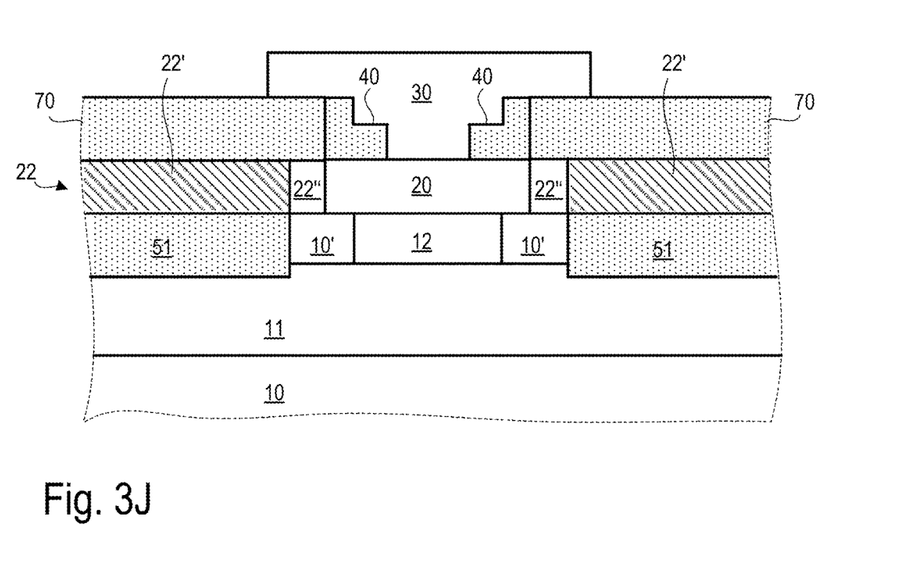
Figure 3K:
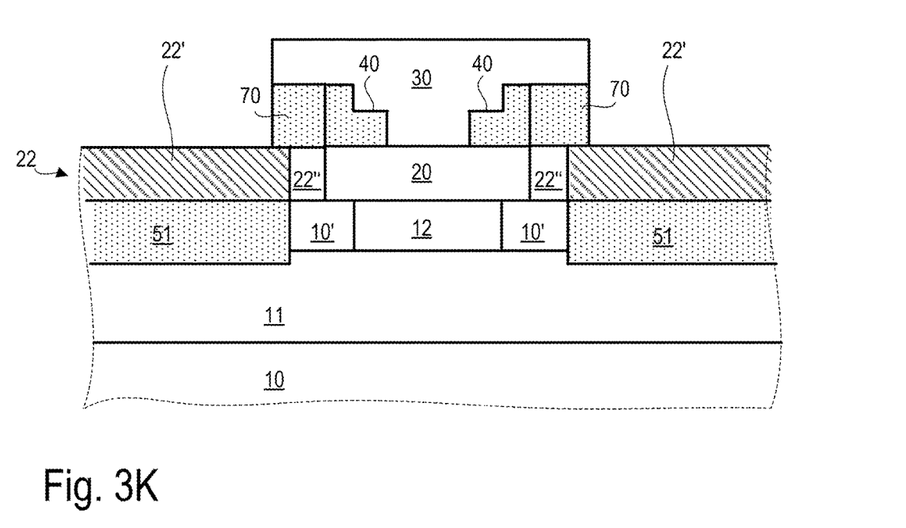

FIG. 3J illustrates the deposition of the emitter region 30 on top of the base region 20. The semiconductor material forming the emitter region 30 is deposited to fill, at least partly, the opening 80 and to cover the base region 20 to form a pn-junction between base region 20 and emitter region 30 (i.e. the base-emitter diode). As shown in FIG. 3J, the collector region 30 may even cover a portion of the insulating layer 70. The emitter region 30 is doped with dopants of the second doping type (i.e. n-type in the present example). In a final step as shown in FIG. 3K, the insulating layer 70 is at least partly removed to expose only the polycrystalline base contact layer 22' and allow contacting the base contact layer 22 in a later process step.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for fabricating a bipolar transistor (BT), the method comprising:
forming a base contact layer on top of a semiconductor body, the base contact layer comprising:
an outer portion comprising a polycrystalline structure; and
an inner portion comprising a monocrystalline structure,
wherein the base contact layer is doped with dopants of a first doping type and
wherein the semiconductor body comprises a buried contact layer;
forming an insulating layer on top of the base contact layer;
forming opening through the insulating layer and the base contact layer:
to remove a sub-portion of the monocrystalline inner portion of the base contact layer such that:
a part of the monocrystalline inner portion remains under the insulating layer; and
outer walls of the monocrystalline inner portion contact inner walls of the polycrystalline outer portion in a horizontal direction; and
inner walls of the remaining part of the monocrystalline inner portion form at least part of the opening;
forming, through the opening, a collector region in a first semiconductor layer, and
wherein the collector region:
is doped with dopant atoms of a second doping type,
laterally adjoins a remaining portion of the first semiconductor layer, and
is between the remaining portions of the first semiconductor layer in a horizontal direction;
after forming the collector region, forming a monocrystalline base region on top of the collector region, the base region being doped with dopants of the first doping type and the base region laterally adjoining the inner walls of the remaining part of the inner portion such that:
the base region replaces the removed sub-portion of the monocrystalline inner portion; and
in a horizontal direction the remaining part of the inner portion is between the base region and the outer portion,
wherein the base region and the base contact layer form a single, horizontal layer;
forming an emitter region doped with dopants of the second doping type on top of the base region.

2. The method of claim 1, further comprising:
forming insulating spacers on top of the base region, wherein the emitter region is formed on the base region, so that the spacers laterally enclose the emitter region.

3. The method of claim 1, the method further comprising, prior to forming the base contact layer:
forming at least two trenches on the top surface of the semiconductor body that are laterally spaced apart; and
filling the trenches at least partially with insulating material.

4. The method of claim 1, wherein the base contact layer is formed on the first semiconductor layer and the insulating trenches.

5. The method of claim 1, wherein the base region is formed on top of the collector region such that it is electrically connected by the base contact layer and forms a pn-junction with the collector region.

6. The method of claim 1, wherein prior to forming the collector region the method comprises forming insulating spacers in the opening over the first semiconductor layer.

7. The method of claim 6, wherein the method further comprises following an ion implantation, removing the insulating spacers.

8. The method of claim 1, wherein the base region comprises a monocrystalline structure and the monocrystalline structure of the base region is self-aligned with the monocrystalline structure of the inner portion of the base contact layer.

9. The method of claim 1, wherein the inner portion of the base contact layer is grown as an epitaxial layer.

10. A method for fabricating a bipolar transistor (BT), the method comprising:
forming a base contact layer on top of a semiconductor body, the base contact layer comprising:
an outer portion comprising a polycrystalline structure, the outer portion directly formed on top of a trench isolation structure of the semiconductor body; and
an inner portion comprising a monocrystalline structure,
forming an insulating layer on top of the base contact layer;
forming an opening through the insulating layer and the base contact layer:
to remove a sub-portion of the monocrystalline inner portion of the base contact layer such that:
a part of the monocrystalline inner portion remains under the insulating layer; and
outer walls of the inner portion contact inner walls of the polycrystalline outer portion in a horizontal direction; and
inner walls of the remaining part of the inner portion form at least part of the opening;
forming, through the opening, a collector region in a first semiconductor layer, and
wherein the collector region:
is doped with dopant atoms of a second doping type,
laterally adjoins a remaining portion of the semiconductor layer, and
is between the remaining portions of the first semiconductor layer in a horizontal direction;
after forming the collector region, forming a monocrystalline base region on top of the collector region, the base region being doped with dopants of the first doping type and the base region laterally adjoining the inner walls of the remaining part of the inner portion such that:
the base region replaces the removed sub-portion of the monocrystalline inner portion; and
in a horizontal direction the remaining part of the inner portion is between the base region and the outer portion,
wherein the base region and the base contact layer form a single, horizontal layer;
forming an emitter region doped with dopants of the second doping type on top of the base region.

11. A method for fabricating a bipolar transistor (BT), the method comprising:
forming a semiconductor body comprising a buried contact region;
forming shallow trenches through a first semiconductor layer to expose the buried contact region and filling the shallow trenches, at least in part, to form a shallow trench isolation (STI) structure laterally surrounding a remaining portion of the first semiconductor layer;
depositing a base contact layer on the filled shallow trenches and the first semiconductor layer, such that the base contact layer comprises an inner portion comprising a monocrystalline structure, wherein the inner portion is located directly over the first semiconductor layer and laterally between an outer portion, wherein the outer portion comprises a polycrystalline structure formed directly over the STI structure and in a same first horizontal plane as the inner portion;

doping the base contact layer such that no doping atoms penetrate to the first semiconductor layer through the base contact layer inner portion and outer portion;

forming an insulation layer over the base contact layer and forming an opening that penetrates at least to the first semiconductor layer such that:

walls of the opening comprise the insulating layer and the inner portion of the base contact layer that remain under the insulating layer, and a floor of the opening is the first semiconductor layer, wherein a horizontal dimension of the inner portion is configured to prevent dislocations diffusing laterally from the outer portion through the inner portion as far as the walls of the opening;

forming a collector region in the first semiconductor layer, wherein:

the collector region is located in a same second horizontal plane and laterally between remaining portions of the first semiconductor layer, wherein a width of the collector region is less than a width of the walls of the opening, and the inner portion of the base contact region is protected from implantation exposure from the forming of the collector region;

forming a monocrystalline base region such that the monocrystalline base region forms electrical contact with the inner portion, is self-aligned with the inner portion and is in the same first horizontal plane as the inner portion and outer portion; and forming an emitter region on top of the base region.

* * * * *